United States Patent [19]

Darken

[11] Patent Number: 4,873,122

[45] Date of Patent: Oct. 10, 1989

[54] TREATING LAMINATES WITH A WETTING/REDUCING SOLUTION AFTER DESMEARING WITH PERMANGANATE

[75] Inventor: Jeffrey Darken, Woking, England

[73] Assignee: OMI International Corporation, Warren, Mich.

[21] Appl. No.: 54,715

[22] Filed: May 27, 1987

[30] Foreign Application Priority Data

Jun. 9, 1986 [GB] United Kingdom ................. 8613960

[51] Int. Cl.[4] .......................... B05D 5/12; B05D 3/04; B05D 3/10; B05D 1/18

[52] U.S. Cl. ........................................ 427/97; 427/96; 427/306; 427/443.1

[58] Field of Search ................... 427/97, 98, 304, 305, 427/306, 443.1, 96

[56] References Cited

U.S. PATENT DOCUMENTS

| | | | |
|---|---|---|---|
| 3,930,963 | 1/1976 | Polichette et al. | 427/98 |
| 4,042,729 | 8/1977 | Polichette et al. | 427/306 |
| 4,054,693 | 10/1979 | Leech et al. | 427/306 |
| 4,073,740 | 2/1978 | Polichette et al. | 427/322 |
| 4,425,380 | 1/1984 | Nuzzi et al. | 427/98 |
| 4,515,829 | 5/1985 | Deckert et al. | 427/98 |
| 4,634,468 | 1/1987 | Gulla et al. | 427/304 |
| 4,668,532 | 5/1987 | Moisan et al. | 427/97 |
| 4,751,106 | 6/1988 | Wilkinson et al. | 427/97 |
| 4,756,930 | 7/1988 | Kukanskis et al. | 427/97 |
| 4,775,449 | 10/1988 | Dumas et al. | 427/306 |

OTHER PUBLICATIONS

*Hackh's Chemical Dictionary*, 3rd Ed., Julius Grant, McGraw-Hill Book Co., Inc., N.Y., pp. 425-427, 1966.

Primary Examiner—Norman Morgenstern
Assistant Examiner—Marianne L. Padgett
Attorney, Agent, or Firm—Richard P. Mueller

[57] ABSTRACT

An aqueous composition is provided for treating a laminate in the manufacture of a printed circuit board, the composition comprising a wetting agent, which has a positively charged quaternary nitrogen atom, and a reducing agent which is compatible with the wetting agent. Preferably the reducing agent is hydroxylamine or one or more of its salts, but oxalic acid or one or more oxalates may, alternatively or as well, be used. The compatibility of the wetting and reducing agents enables the number of process steps to be reduced.

5 Claims, No Drawings

TREATING LAMINATES WITH A WETTING/REDUCING SOLUTION AFTER DESMEARING WITH PERMANGANATE

This invention relates to a step in the manufacture of printed circuit boards.

Multilayer printed circuit boards are well known and generally comprise a laminate of epoxy glass layers and copper circuit layers as required. Frequently the laminate is drilled or otherwise formed with holes to enable electrical or electronic components to be secured to the board. It is usual to plate one or both sides of the board with copper, for example by an electroless technique, and the walls of the holes should also generally be plated: this leads to boards having what is known as "through-plated" holes.

It is usual to pre-treat the surfaces on which copper is to be deposited with a catalyst. Suitable known catalysts include colloidal suspensions of palladium in aqueous tin chloride solutions. After treatment to cause the surfaces to become catalytic, the board may be contacted with an accelerator such as fluoboric acid and then plated.

Prior to the catalysation step, the board is treated with a conditioning preparation. Conditioning preparations generally contain quaternary ammonium wetting agents. The function of the conditioning preparation is to enhance the receptivity of the surfaces of the drilled holes of the printed circuit board to the adsorption of catalytic palladium particles. It is important that the level of adverse contaminants on the board at this stage be sufficiently low as not to interfere with this conditioning step or the subsequent catalysation or other steps; and it is with this that the present invention is concerned.

Prior to the conditioning step, during their manufacture printed circuit boards, particularly multilayer boards, are often immersed in a permanganate bath, for example alkaline potassium permanganate, in order to remove resin smear and improve adhesion of the copper in the through-plated holes. This inevitably tends to leave manganese dioxide residues on the epoxy glass surfaces in the hole walls, which often interferes with further processing, particularly with conditioning the hole walls to receive catalyst and hence with the degree of coverage of the final copper plated product.

Reducing agents which remove manganese dioxide, such as hydrogen peroxide-sulphuric acid mixtures on the one hand and sulphite mixtures on the other hand are well known. But such solutions tend to be incompatible with conditioning solutions and the multilayer boards therefore need to be rinsed twice before conditioning.

EP-A-0137981 discloses the use of hydroxylamine sulphate as a reducing agent for manganese residues left after treatment with permanganate, but follows the received wisdom in the art by applying the reducing agent in a separate step from the application of the conditioner and by providing a water rinse step between the reduction and conditioning steps. It has now been discovered that hydroxylamine and its salts belong to a class of reducing agents having the hitherto unknown property of giving little or no interference with the conditioning preparation. In fact, the degree of interference is so low that the reducing agent can actually be incorporated in the conditioning preparation.

According to a first aspect of the invention, there is provided an aqueous composition for treating a laminate for a printed circuit board, the composition comprising a wetting agent having a positively charged quaternary nitrogen atom and a reducing agent compatible with the wetting agent. Preferably the reducing agent is hydroxylamine or one or more of its salts, but oxalic acid or one or more oxalates may, alternatively or as well, be preferred. Hydrazine or one of its salts may be used as a reducing agent but it is environmentally less favoured. The non aqueous ingredients will generally be wholly in aqueous solution.

The reducing agent is sometimes referred to as a neutraliser in this context, and the wetting agent can be called a conditioner; so a composition in accordance with a first aspect of the invention may be referred to as a neutraliser/conditioner.

Hydroxylamine, when used as the or one of the reducing agents, is preferably present as a salt. Among the preferred salts are sulphate and the hydrohalides, for example hydrochloride. Similarly, oxalate salts, for example the Group Ia metal salts such as sodium and potassium, are preferred to free oxalic acid. The precise nature and amounts of the species present in the working composition will however depend on its pH.

The reducing agent will be present in an amount effective to reduce all or an acceptably high proportion of the manganese dioxide and/or other deleterious manganese oxidation products from the laminate and is preferably present in an amount of from 1 to 100 g/l, with from 10 to 50 g/l being typical and from 15 to 30 g/l being preferred.

The purpose of the quaternary wetting agent is to make the surface(s) of the laminate receptive to a catalyst which, in turn, serves the purpose of rendering the surface(s) catalytic to the deposit of copper. The quaternary wetting agent may be a quaternary ammonium wetting agent of general formula (I):

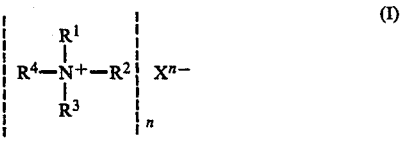

wherein
each of $R^1$, $R^2$, $R^3$ and $R^4$ independently represents a $C_1$ to $C_{20}$ alkyl group, a $C_6$ or $C_{10}$ aryl or a $C_7$ to $C_{30}$ arylalkyl or alkylaryl group, each optionally substituted with a group $-OR^5$, $-NHR^5R^6$, where each of $R^5$ and $R^6$ independently represents a hydrogen atom or a $C_1$ to $C_{20}$ alkyl group;

and $X^{n-}$ represents a compatible anion of acidity n, where n is an integer, generally 1 to 4 but preferably 1.

The nature of the substituents on the quaternary ammonium cation will in general be selected so that the cation is sufficiently soluble in and otherwise compatible with the solution. At least two of the substituents $R^1$, $R^2$, $R^3$ and $R^4$ will preferably represent a $C_1$ to $C_4$ alkyl or substituted alkyl group, especially methyl, ethyl or propyl. But it is also preferred that at least one of the substituents $R^1$, $R^2$, $R^3$ and $R^4$ be substituted as described, and that at least one of $R^5$ and $R^6$ represents a $C_6$ to $C_{20}$ alkyl group such as stearyl.

Preferred cations include stearylamidopropyldimethyl-2-hydroxyethylammonium and oxyethylalkylammonium. Stearylamidopropyldimethyl-2-hydroxyethylammonium phosphate is sold by Ciba-Geigy under the trade mark CYASTAT-SP.

The cation may alternatively be a $C_1$-$C_{20}$ alkyl pyridinium moiety, such as cetyl pyridinium.

The anion will generally be selected so that it too is sufficiently soluble in and otherwise compatible with the solution. It may be a halide ion such as chloride or bromide, or a nitrate, phosphate, sulphate, hydrogen phosphate or dihydrogen phosphate ion. Preferred anions are nitrate and dihydrogen phosphate.

The wetting agent may be present in an amount of 0.1 to 10 g/l, typically 0.5 to 5 g/l, for example 1 to 3 g/l.

The aqueous solution will also preferably contain a complexing agent, which functions to clean the surface by removing oxides. The complexing agent will generally be amine or an amine derivative. Suitable complexing agents include soluble amines, alkanolamines (especially $C_1$-$C_6$ alkanolamines such as monoethanolamine, diethanolamine, triethanolamine), amine carboxylic acids, hydroxycarboxylic acids and amine phosphoric acids. Improved results may be obtainable by using such complexing agents, of which soluble amine carboxylic acids are preferred. Tetraethylene pentamine may also be used. In general it should be noted that the complexing agent should be non-volatile if the composition containing them is to be used above room temperature.

The complexing agent may be present in an amount of 1 to 50 g/l, typically 5 to 30 g/l, for example 10 to 20 g/l.

Another preferred component of the solution is a nonionic surfactant. Examples of compatible and suitable nonionic surfactants are ethoxylated linear alkyl alcohols, such as an ethoxylated nonyl phenol containing for example about 12 moles of ethylene oxide. The nonionic surfactant acts as a wetting agent generally to provide a water-break free surface.

The nonionic surfactant may be present in an amount of 0.1 to 20 g/l, typically 0.5 to 5 g/l, for example 1 to 3 g/l.

The pH of the composition is not believed to be critical but may range from 1 to 14; preferably the pH is below 7 as better results appear to be obtained in acid conditions. A pH range of from 2 to 4 is especially preferred.

According to a second aspect of the invention, there is provided a method of treating a laminate for a printed circuit board, which laminate has previously been treated with permanganate, the method comprising contacting the laminate with an aqueous composition of a wetting agent having a positively charged quarternary nitrogen atom and a reducing agent compatible with the wetting agent.

The laminate will generally comprise a plurality of layers of epoxy glass resin. The method of contacting will normally be immersion, although in some circumstances spraying may be used.

The contact time for the wetting agent/reducing agent solution may range from 15 seconds to 30 minutes, typically from 30 seconds to about 15 minutes, for example from 1 to 10 minutes, but in any event the contact time appropriate for the quaternary ammonium wetting agent, which serves as a conditioner, is generally to be taken into account. The temperature at which the treatment of the invention is to be carried out may range from room temperature or below (for example from 5 degrees Centigrade) up to 80 or 90 degrees Centigrade, although when using free hydroxylamine base caution should be exercised at the upper end of the range as hydroxylamine can be decomposed by hot water. Temperatures of from room temperature up to 75 degrees Centigrade are preferred.

The processing of multilayer laminates in the manufacture of multilayer printed circuit boards can be shortened and simplified by means of the present invention to such an extent that apparatus which conventionally could only be used for double sided boards can now be used to process multilayer boards. The reason for this is as follows. Multilayer boards contain layers or tracks of copper sandwiched between non-conductive layers, which are usually made of epoxy glass. When such boards are drilled, frictional heat generated by the drill bit melts the epoxy and smears it over the internal copper: hence the use of permanganate as a de-smearing agent. Drilled multilayer boards have up till now been treated as follows: permanganate de-smear—rinse—rinse—neutraliser—rinse—rinse—conditioner—rinse—rinse—etch (to make external copper layers adhesive for the deposition of electroless copper)- subsequent processing.

the simpler double sided boards do not have the same degree of problems from smearing (as there are no internal copper layers or tracks), they, when drilled, can simply be treated by the following steps: conditioner—rinse—rinse—etch—subsequent processing. Thus there are only four steps after drilling up to and including the etch, and so processing apparatus needs only four work stations to cover these steps.

By means of the present invention, drilled multilayer boards can be processed by only four steps between drilling and etching as follows: permanganate de-smear—neutraliser/conditioner—rinse—etch; and so again only four work stations are needed. Therefore, simply by virtue of the improved chemistry of the present invention, simple double layer pcb processing apparatus can, with only relatively minor modifications, be used in the manufacture of the much more complex multilayer pcb's.

According to a third aspect of the invention, there is provided a method of preparing a drilled multilayer laminate for a printed circuit board for being receptive to the deposit of copper, the method comprising (a) treating the laminate with permanganate to de-smear the drilled hole(s), (b) contacting the laminate with an aqueous composition of a wetting agent having a positively charged quaternary nitrogen atom and a reducing agent compatible with the wetting agent, (c) mildly etching an external copper layer of the laminate to render its adhesive qualities suitable for the deposition of electroless copper thereon, (d) contacting the laminate with an acidic solution, (e) contacting the laminate with a composition for depositing catalyst for rendering the laminate's surfaces catalytic to the deposit of copper on them and optionally (f) further contacting the laminate with an accelerator composition.

The above method is a variation on the type of printed circuit board manufacture known as the subtractive method. When an additive method is used, the laminate will not have an external copper layer, and so the mild etching (or "microetching") step (c) will then be omitted.

Rinsing would normally take place (once if not twice) between each step, except between steps (d) and (e). However, when there is no rinsing after step (a), as is made possible by the present invention, it is preferred that the aqueous composition used in step (b) include a buffer. Oxalate, which can constitute the reducing agent, may fulfil this role.

The permanganate may be provided by an alkaline solution, for example an alkaline solution of an alkali metal salt of permanganate, for example potassium permanganate or sodium permanganate.

The accelerator may be fluoboric acid.

Subsequent electroless plating of copper may be undertaken by any suitable plating compositions, such as conventional compositions using formaldehyde as a reducing agent. The plated laminate may subsequently be processed conventionally to yield a finished printed circuit board.

Other preferred features of the second and third aspects of the invention may be as for the first aspect, *mutatis mutandis*.

The invention also extends to a laminate which has been subjected to either of the above methods.

The following examples illustrate the invention.

EXAMPLE 1

A four-layer epoxy-bound glass printed circuit board with drilled holes was subjected to a de-smear operation by immersion in a solution of 50 g/l NaOH and 45 g/l potassium permanganate at 65 degrees centigrade for 20 minutes. After rinsing, inspection revealed the presence of manganese dioxide on the hole walls. The board was further immersed in a solution of conditioning preparation containing 1.35% monoethanolamine, 0.3% stearylamidodimethylhydroxyethylammonium phosphate and 0.06% ethoxylated nonyl phenol containing 12 moles of ethylene oxide; the conditioner additionally contained 20 g/l hydroxylamine hydrochloride. This further immersion was carried out for 5 minutes at 65 degrees Centigrade. Observation revealed gassing and the removal of manganese dioxide. Further inspection revealed the absence of manganese dioxide on the hole walls. The board was further processed down the normal sequence of catalysation and acceleration and then plated for 30 minutes in a conventional electroless copper plating preparation to give a copper deposit 2 to 2.5 microns thick. Inspection of the plated holes, using backlight, revealed complete coverage of the hole walls with electroless copper.

EXAMPLE 2

(Comparison Example)

A neutraliser solution was prepared as follows:
20 g/l Tri-sodium salt of N-(2-hydroxyethyl) ethylenediamine-N,N',N'-triacetic acid
6.6 g/l Hydroxylamine sulphate
5 ml/l Sulphuric acid
pH=2.4 at 20° C. and heated to 65° C. A sample of 6 layer epoxy glass circuit board drilled with 1 mm holes was de-smeared (removal of drill smear) by immersion in a solution of: 40 g/l Potassium permanganate 40 g/l Sodium hydroxide at 70° C. for 20 minutes. The board was then rinsed briefly in cold water and immersed in the neutraliser solution for 3 minutes. On immersion gas evolution was observed.

After rinsing, a part of the board was then sectioned and the hole walls inspected using a microscope for the presence of manganese dioxide. None was found. The remainder of the board was processed as follows:
(a) Etch for 2 minutes in 100 g/l sodium persulphate solution containing 20 ml/l sulphuric acid
(b) Rinse
(c) Immersion in a solution of 200 g/l sodium chloride and 50 ml/l hydrochloric acid for 30 seconds
(d) Immersion in a palladium/tin catalyst solution containing 150 mg/l palladium for 5 minutes
(e) Rinse
(f) Immersion for 2 minutes in a 10% solution of fluoboric acid
(g) Rinse
(h) Electroless copper plate in a conventional electroless copper plating preparation for 15 minutes produce an average deposit thickness of 0.7 microns, and again sectioned so that the coverage of the electroless copper plating down the holes could be inspected using the backlight test. No copper deposit was found on the glass fibres present in the hole wall.

EXAMPLE 3

The procedure of Example 2 was carried out except that the neutraliser solution contained in addition 1 ml/l of a 50% solution of stearylamido propyl dimethyl 2-hydroxyethyl ammonium nitrate (Cyastat SN 50 from Ciba Geigy).

After treatment in the neutraliser no manganese dioxide remained on the hole walls.

After plating in electroless copper for 15 minutes to produce 0.7 microns of copper plating inspection of the plated holes revealed the complete coverage of the glass fibres with deposited copper.

EXAMPLE 4

The neutraliser solution of Example 3 was used in conjunction with the procedure of Example 2 except that no rinsing was employed between the permanganate de-smearing solution and the neutralising solution, so contaminating the neutraliser directly with permanganate ions.

The permanganate colour was quickly destroyed by the neutraliser and inspection after immersion revealed the absence of manganese dioxide on the hole walls.

After further processing as in Example 2 inspection, using backlight, revealed complete coverage of the hole walls with electroless copper deposit.

EXAMPLE 5

The procedure of Example 2 was carried out except that the neutraliser solution was of the following composition:
6.0 g/l hydroxylamine sulphate 1 ml stearylamidopropyldimethyl-2-hydroxyethyl ammonium nitrate (50% solution)
pH=3.8/20° C.

After immersion in this solution, inspection revealed the absence of manganese dioxide on the hole walls. After plating with 0.6–0.8 microns of electroless copper inspection revealed that complete coverage of the hole walls with deposited copper had been achieved.

EXAMPLE 6

The procedure of Example 2 was carried out except that the neutraliser solution was of the following composition:
6.0 g/l hydroxylamine sulphate 1 ml/l oxyethylalkyl ammonium phosphate (50% solution) pH=3.8/20° C.

After immersion in this solution, inspection revealed the absence of manganese dioxide on the hole walls. After plating with 0.6–0.8 microns of electroless copper inspection revealed that complete coverage of the hole with deposited copper had been achieved.

EXAMPLE 7

(COMPARISON EXAMPLE)

The procedure of Example 2 was carried out except that the neutraliser solution was of the following composition:
6.0 g/l hydroxylamine sulphate
pH=3.8/20° C.

After immersion in this solution inspection revealed the absence of manganese dioxide on the hole walls. After plating with 0.6–0.8 microns of electroless copper, inspection using backlight revealed that although epoxy resin surfaces on the hole wall had been covered with deposited copper there was no deposit on the surfaces of the exposed glass fibre.

EXAMPLE 8

The procedure of Example 2 was carried out except that the neutraliser solution was of the following composition:
20 g/l Potassium oxalate monohydrate
6 ml/l sulphuric acid
1 ml/l stearylamidopropyl dimethyl 2 hydroxyethyl ammonium nitrate (50% solution)
pH=2.5/20° C.

No rinsing was employed between the permanganate de-smearing solution and the neutralising solution thus contaminating the latter directly with permanganate ions.

The permanganate colour was quickly destroyed by the neutraliser and inspection after immersion revealed the absence of manganese dioxide on the hole walls.

After further processing, as in Example 2, inspection, using backlight, revealed complete coverage of the hole walls with electroless copper deposit.

What is claimed is:

1. A method of treating a laminate for a printed circuit board, which laminate has been previously treated with permanganate, the method comprising contacting the board with an aqueous composition of a wetting agent having a positively charged quaternary nitrogen atom and a reducing agent compatible with the wetting agent, which reducing agent is selected from:
    (a) hydroxylamine and salts thereof; and
    (b) oxalic acid and salts thereof, and mixtures thereof and wherein such contacting is carried out after the permanganate treatment with no intervening treatment therebetween.

2. The method of claim 1 wherein the contacting time is from 15 seconds to 30 minutes.

3. A method of preparing a drilled multi-layer laminate for a printed circuit board for being receptive to the deposition of copper, the method comprising the steps of:
    (a) treating the laminate with permanganate to de-smear the drilled holes, thereafter with no intervening treatment,
    (b) contacting the laminate with an aqueous composition of a wetting agent having a positively charged quaternary nitrogen atom and a reducing agent compatible with the wetting agent, which reducing agent is selected from:
        (i) hydroxylamine and salts thereof; and
        (ii) oxalic acid and salts thereof, and mixtures thereof,
    (c) when there is an external copper layer on a said laminate, mildly etching said copper layer to render its adhesives qualities suitable for the deposition of electroless copper thereon,
    (d) contacting the laminate with an acidic solution, and
    (e) contacting the laminate with a composition for depositing catalyst for rendering the laminate's surfaces catalytic to the deposition of copper on them.

4. The method of claim 3 wherein after the step (e), the laminate is contacted with an accelerator composition.

5. The method of claim 4 wherein the permanganate is an alkali solution of a permanganate salt and the accelerator composition is fluoboric acid.

* * * * *